United States Patent [19]

Buss et al.

[11] 4,072,978
[45] Feb. 7, 1978

[54] CCD INPUT AND NODE PRESET METHOD

[75] Inventors: Dennis Darcy Buss, Richardson; Stephen P. Emmons; James Brockman Barton, both of Dallas, all of Tex.

[73] Assignee: Texas Instruments Incorporated, Dallas, Tex.

[21] Appl. No.: 814,528

[22] Filed: July 11, 1977

Related U.S. Application Data

[63] Continuation of Ser. No. 617,451, Sept. 29, 1975, abandoned, which is a continuation of Ser. No. 373,567, June 25, 1973, abandoned.

[51] Int. Cl.² ............................................. H01L 29/78
[52] U.S. Cl. ................................ 357/24; 307/221 D; 307/304
[58] Field of Search .............. 357/24; 307/221 D, 304

[56] References Cited
U.S. PATENT DOCUMENTS

| | | |
|---|---|---|
| 3,755,793 | 8/1973 | Ho et al. ................................ 357/24 |
| 3,760,202 | 9/1973 | Kosonocky ............................ 357/24 |
| 3,789,267 | 1/1974 | Krambeck et al. .................... 357/24 |
| 3,986,198 | 10/1976 | Kosonocky ............................ 357/24 |

OTHER PUBLICATIONS

R. Krambeck et al, "A Doped Surface Two-Phase CCD," Bell Sys. Tech. J., vol. 51 No. 8, Oct. 1973, pp. 1849–1866.

*Primary Examiner*—Stanley D. Miller, Jr.
*Assistant Examiner*—Joseph E. Clawson, Jr.
*Attorney, Agent, or Firm*—James T. Comfort; Charles J. Fassbender

[57] ABSTRACT

MOSFET structures are frequently used to establish the charge level in the first potential well of a CCD in accordance with an external voltage. When employed conventionally there exists a finite amount of charge under the MOSFET gate at the instant of turnoff. An indeterminate amount of this charge flows into the first potential well thereby giving rise to an uncertainty in the amount of charge in the well. Use of the invention disclosed eliminates this source of uncertainty.

9 Claims, 6 Drawing Figures

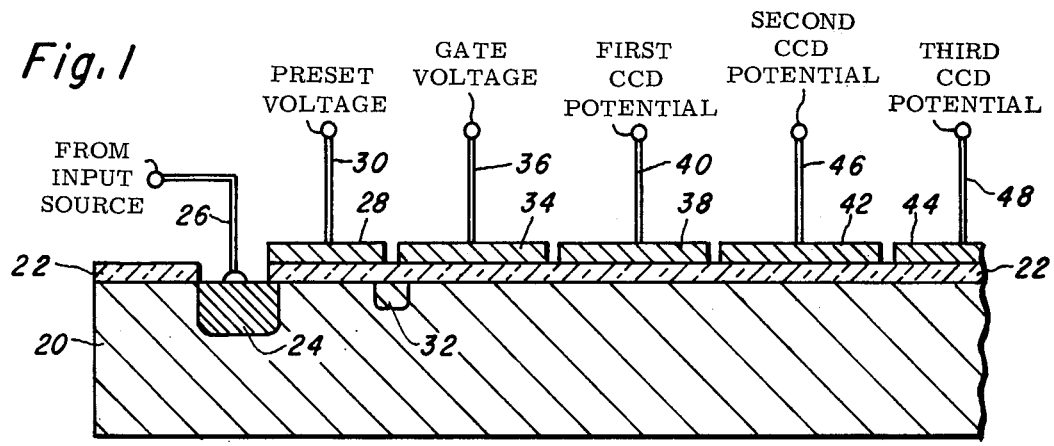
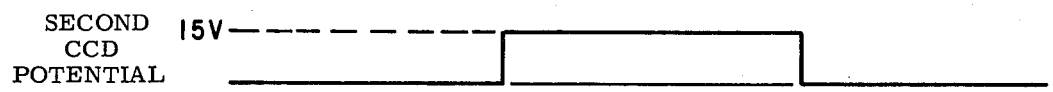
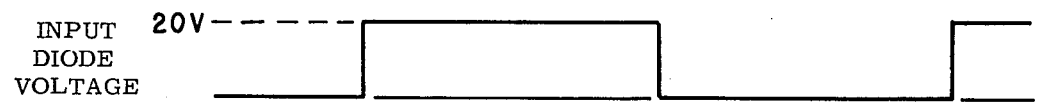

CCD INPUT AND NODE PRESET METHOD

This is a continuation of application Ser. No. 617,451, filed Sept. 29, 1975 which was a continuation of application Ser. No. 373,567 filed June 25, 1973 both now abandoned.

This invention relates to charge-coupled devices and in particular to the input and output of charge-coupled device signals.

A problem common to many charge-coupled device (CCD) applications is the electrical introduction of an external charge into the first potential well of the CCD. In the case of a shift register application, for example, this charge may be representative of the amplitude of the external signal which is introduced into the CCD. In an optical imager, it may be necessary to electrically introduce a fat zero or quiescent charge so as to facilitate the efficient subsequent transfer of charge through the CCD. There is associated with this introduction of charge a noise or uncertainty in the amount of charge introduced and the reduction of this uncertainty to a minimum is frequently a matter of considerable concern.

Conventional techniques for the introduction of charge to the CCD involve the transfer of charge from an input node to the first potential well of the CCD. These methods typically employ a gate electrode formed on the CCD surface which in combination with the input node and the first potential well, functioning as source and drain respectively, comprise a MOSFET. A potential applied to the gate turns the MOSFET on thereby transferring charge from the input node to the first potential well. After this transfer, however, at the instant the MOSFET is turned off, there exists a finite amount of charge stored under the gate. A portion of this charge returns to the input node with the remainder passing to the first potential well. Since the precise division of this stored charge is not reproducible, there results an uncertainty in the total amount of charge placed in the first potential well. This uncertainty represents noise added to the signal represented by the charge.

It is therefore an object of this invention to provide a method for introducing charge into a CCD that is free of this source of uncertainty.

Briefly, in accordance with the method, the electrical signal which is to be introduced is coupled to the gate electrode. While a bias potential is applied to deplete the first CCD potential well, a low voltage is coupled to the input node. This turns the MOSFET on, thereby transferring charge into the first potential well. The voltage on the input node is chosen samll enough to insure that the amount of charge in the first potential well is greater than that corresponding to any possible value of the input signal. The voltage coupled to the input node is then switched to a high value, causing the input node and first potential well to now function as the drain and source respectively of the MOSFET. Charge is withdrawn from the first potential well causing its surface potential to rise until the MOSFET pinches off. Under these circumstances, there is no charge stored under the gate at the instant of pinchoff, and as a result no charge uncertainty occurs. The technique is also useful when it is necessary to preset an amplifier to a specified voltage.

There is disclosed in copending patent application TI-5151, Ser. No. 373,568, now abandoned, also assigned to the same assignee, a technique for reducing the charge uncertainties stemming from thermally induced noise. The present invention may be combined with that technique to provide for very low noise introduction of charge into the CCD. It is also possible to employ the invention for presetting the amplifier at the output of the CCD.

Other objects and features of this invention will be made clear by the following detailed description in connection with the drawings, wherein:

FIG. 1 shows a CCD input structure with a floating diffused region;

FIG. 2 illustrates typical waveforms for introducing an electrical input to a CCD using a floating diffused region;

Figure 3:
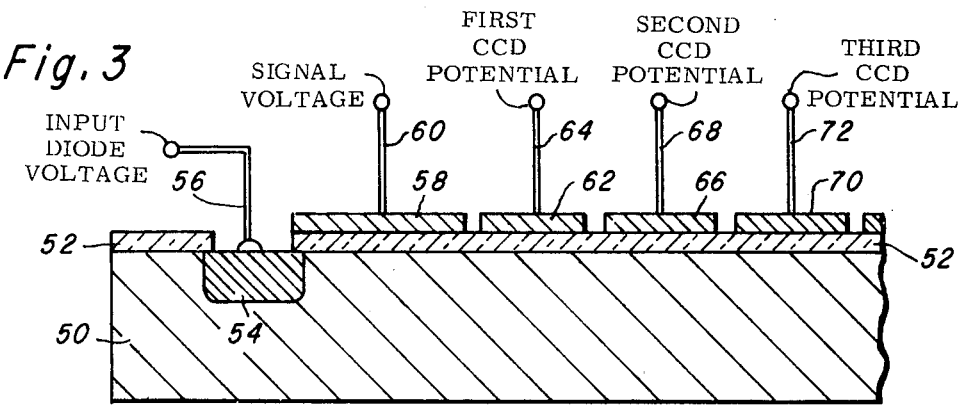
FIG. 3 illustrates a CCD input structure without a floating diffused region.

A structure embodying the invention is illustrated in FIG. 1 wherein, for purposes of illustration, relative dimensions have not been faithfully preserved. The structure is formed on a P-doped silicon substrate 20 but it will be readily understood that other substrate materials and dopants can also be employed. Formed thereon is a thin insulating layer 22 of a material such as silicon dioxide. An opening in the silicon dioxide layer has been formed in the vicinity of an input diode comprised of an N+ doped area 24 along with its ohmic contact and external lead 26, by means of which the diode is connected to an external input source. Also formed in the surface of the substrate is a floating diffused region 32 comprising N+ doped material. On the surface of the silicon dioxide layer and intermediate to the input gate and floating diffused region is located a metallic preset electrode 28 and its external lead 30, by means of which the electrode is connected to an external preset voltage. Also located on the surface of the silicon dioxide layer 22 and in the vicinity of the floating diffused region 32 is a metallic gate electrode 34 and its associated external lead 36, by means of whch the gates electrode is connected to an external gate voltage. Subsequent to the gate electrode 34 are located conventional CCD electrodes 38, 42 and 44 along with their associated external leads 40, 46 and 48. The CCD electrodes are connected to external CCD potential sources for the purpose of storing and transferring charge in the potential wells. While it will be recognized by those skilled in the art that the CCD illustrated in FIG. 1 constitutes a surface channel device, the invention disclosed herein may also be practiced with a buried channel device.

Techniques used for fabrication of a structure such as that shown in FIG. 1 are well known in the art and need not be discussed in detail here.

A possible method of operation of the structure of FIG. 1 involves connecting the input diode lead 26 permanently to the input source. The preset voltage connected to lead 30 is pulsed to a positive level greater than any possible input voltage by at least the threshold voltage. The structure then represents a MOSFET wherein the input diode 24 comprises the source, the preset electrode 28 is the gate, and the floating diffused region 32 is the drain. If the preset voltage exceeds any possible input voltages by at least the threshold voltage of the MOSFET, then the channel is turned on connecting the drain and source. Charge flows from the source to the floating diffused region 32 thereby drawing the potential of the floating diffused region to that of the external input source. When the preset voltage returns to a low level cutting off the MOSFET, the charge is locked in the floating diffused region 32. Subsequently, the gate voltage connected via line 36 to gate electrode 34 is pulsed to a positive voltage greater than any possible input voltage by at least the MOSFET threshold voltage. Simultaneously, the first CCD potential is set to a positive value thereby establishing a first CCD potential well in the region immediately underlying the first CCD electrode 38. Under these circumstances there exists a second MOSFET wherein the source is comprised of the floating diffused region 32, the gate electrode 34 forms the MOSFET gate, and the first CCD potential well becomes the drain. Again, the positive gate voltage turns this MOSFET on thereby transferring the charge from the floating diffused region 32 to the first CCD potential well. In both the transfer of charge to the floating diffused region and the transfer from the floating diffused region to the first CCD potential well, the intent is to employ a pseudo-MOSFET structure to approximate an ideal switch in series with the finite drain resistance. The approximation is not perfect, however, since at the time the MOSFET turns off there will exist a finite amount of charge under its gate electrode. At the time the MOSFET is cut off, a portion of this charge will return to source region with the remainder passing on to the drain. Since the portion of this stored charge which will pass on to the drain is not reproducible, this phenomena gives rise to an uncertainty in the total amount of charge passed to the drain over and above that due to Johnson noise in the channel. The amount of this uncertainty may be so large as to prevent advantageous practice of the invention.

A different method of introducing the input signals enables effective utilization of the floating diffusion region without incurring the charge uncertainty caused by turnoff of the preset electrode and gate electrode. The waveforms illustrated in FIG. 2 will be useful in understanding this procedure. The first three waveforms of FIG. 2 illustrate the voltages applied to the first three electrodes of the CCD proper. Each of these alternates between the zero volt level and +15 volt level shown here with a 50% duty cycle, but a 50% duty cycle is not necessary for successful use of the CCD. The relative timing of the on periods of these voltages is adjusted as is well known in the art to provide for shifting the stored charge down the CCD. Early in the interval when the 15 volt level is applied to the first CCD electrode, a voltage pulse is introduced to the preset electrode 28 of FIG. 1. The amplitude of this pulse, shown as 8 volts in FIG. 2, is representative of the input signal to be introduced to the CCD. This input signal may be a sample of an analog signal, a digital signal, or a fat zero and will always be biased so as to insure that it is a positive voltage for surface channel devices formed on a P-type substrate. During the interval when this voltage pulse is applied to the preset electrode 28, the voltage level applied to the gate electrode 34 is zero volts, thereby insuring that the floating diffused region is electrically isolated from the first CCD potential well. Also, during the first portion of the voltage pulse applied to the preset electrode, the input to the input diode is at a zero volt level. At this time, the combination of the input diode 24, the preset electrode 28, and the floating diffused region 32 comprise a MOSFET with the input diode functioning as the source, the preset electrode as the gate, and the floating diffused region as the drain. Under the voltage conditions existing, charge is transferred from the input diode to the floating diffused region thereby drawing the surface potential of the floating diffused region to that of the input diode; that is, zero volts. At this point, while the voltage pulse is still applied to the preset electrode 28, the voltage on the input diode 24 is switched to a high level, shown as 20 volts in FIG. 2. The 20 volt level is illustrative, it being only necessary that this voltage be greater than the largest positive voltage which might be applied to the preset electrode 28 minus the MOSFET threshold. At this point, the input diode 24 changes roles, now functioning as the drain of the MOSFET with the floating diffused region 32 becoming the source. Charge is now transferred from the floating diffused region 32 through the channel to the input diode 24, thereby causing the surface potential of the floating diffused region to rise until it reaches a level which differs from the voltage level of the pulse applied to the preset electrode 28 by exactly the threshold potential of the MOSFET. At this point, the MOSFET is said to have pinched off and since, under these conditions, at the instant of pinchoff there is no charge stored under the preset electrode, the act of turning off the MOSFET does not give rise to uncertainty in the amount of charge transferred into the floating diffused region. The only uncertainty in the amount of charge stored in the floating diffused region 32 is that stemming from Johnson noise associated with the finite channel resistance of the MOSFET. It can be shown analytically that the mean square value of this charge uncertainty is $\frac{2}{3}$ kTC where C now is the capacitance of the floating diffused region. Again, as a result of the lack of the requirement for an ohmic contact on the floating diffused region, it is possible to make this diffusion very small thereby reducing its capacitance to a value considerably below that achievable for the first potential well of the CCD.

At this point, the preset electrode is shown as being returned to the zero volt level, thereby locking the charge into the floating diffused region. Alternatively, the preset gate voltage can be left uncharged because subsequent steps will tend to pinch off the first MOSFET even more. Subsequently, while the voltage applied to the first CCD electrode is still at the +15 volt level and the second CCD electrode is at zero volts, a voltage pulse is applied to the gate electrode 34. This voltage level must be greater than the largest voltage which might be applied to the preset electrode 28 and is illustrated as 10 volts in FIG. 2. Now the gate electrode 34 functions as the gate of a second MOSFET with the floating diffused region functioning as a source and the first CCD potential well, whose surface potential initially is at approximately the +15 volt level, functioning as the drain. Charge flows from the floating diffused region 32 through the channel to the first CCD potential well, thereby causing the surface potential of the floating diffused region to rise until it reaches a point that differs from the potential on the gate electrode 34 by exactly the threshold voltage of the MOSFET. The amount of charge which is transferred from the floating diffused region 32 to the first potential well of the CCD is directly related to the difference between the amplitude of the pulse applied to the preset electrode, shown as 8 volts in FIG. 2, and the amplitude of the voltage applied to the gate electrode 34, shown as 10 volts in FIG. 2. Since the amplitude of the pulse applied to the gate electrode will always be the same, it follows that the amount of charge transferred to the first CCD potential well is inversely indicative of the amplitude of the preset or signal voltage. Again, the turnoff of this second MOSFET having been accomplished through the pinchoff phenomena, the charge uncertainty associated with this second transfer is also given by ⅔ kTC where the C in this expression is the capacitance of the floating diffused region. Thus, each of the two transfers of charge, the first involving presetting of the floating diffused region and the second involving transfer of the signal charge from the floating diffused region to the first CCD potential well, ha associated with it a charge uncertainty whose mean square value is given by ⅔ kTC. Since these two uncertainties are uncorrelated, it follows that the mean square value of the net charge uncertainty in the first CCD potential well is the sum of these two; that is, 4/3 kTC. It being possible, as is pointed out above, to make the dimensions and therefore the capacitance of the floating diffused region quite small in comparison with that of the first CCD potential well, this novel means of introducing the signal or fat zero charge to the first CCD potential well results in considerably less charge uncertainty than that achievable with conventional methods. This reduction in the dimensions of the floating diffused region and consequent reduction of its capacitance is clearly realizable in the case where only a fat zero or a low level signal is being introduced to the CCD; that is, where a small amount of charge is to be transferred to the first potential well. In the case where an external electrical signal is to be introduced, reduction of the dimensions of the floating diffused region below those of the CCD potential wells may limit the dynamic range of the device. Even in this case, however, there exists an advantage stemming from the use of the floating diffused region. In the preceding discussion, two transfers of charge occurred and in each case the transfer was terminated by pinching off a MOSFET at the point where a gate electrode overlies a small portion of the floating diffused region. This gives rise in each case to a well defined pinchoff. In the discussion to follow, it will be seen that the transfer of charge can be terminated by pinching off a MOSFET even when the floating diffused region is not employed. In this case, however, the pinchoff occurs at the point between the first potential well and a gate electrode which does not overlie the potential well. Pinchoff at this point is subject to an effective threshold which is higly dependent on the condition of the exposed oxide layer and therefore strongly influenced by ambient variations. Use of the floating diffused region wherein the critical area of the oxide is protected minimizes this problem.

It should also be noted that, in the preceding description and in that immediately following, the bias potential is shown as being applied to the first CCD electrode during the entire interval while the charge is transferred into the floating diffused region and while charge is transferred to the first potential well. Actually, as regards introduction of the charge to the CCD, it is only necessary that the first CCD electrode be biased during the transfer of charge from the floating diffused region to the first potential well.

It is possible to use the structure of FIG. 1 in a slightly different manner; that is, with the roles of the voltages applied to preset electrode 28 and gate electrode 34 interchanged. In this case, it is probably desirable to reduce the amplitude of the pulse applied to the preset electrode to something less than 8 volts, it being necessary only that this amplitude be greater than the threshold voltage of the first MOSFET. If the threshold voltage of the first MOSFET is 2 volts, for example, a desirable pulse amplitude for the preset electrode might be 3 volts. In this case, the amplitude of the pulse applied to the gate electrode 34, shown as 10 volts in FIG. 2, would be representative of the signal or fat zero to be introduced to the CCD. Again, in this mode it is seen that the amount of charge introduced into the first CCD potential well is proportional to the signal or fat zero voltage and the mean square value of the charge uncertainty is again given by 4/3 kTC.

It is also possible to practice this method for low noise introduction of charge into the first CCD potential well without employing the intermediate floating diffused region. FIG. 3 illustrates a portion of a CCD structure formed on a P-doped semiconductor substrate 50. An insulating layer 52 typically of silicon dioxide is formed on the surface of the substrate 50 and removed in a small area to permit formation of an input diode structure 54 with an ohmic contact and external lead 56. Adjacent the input diode structure 54 is located a gate electrode 58 and associated external lead 60 followed by CCD electrodes 62, 66 and 70, each with an external lead 64, 68 and 72. Again, methods for fabrication of such a structure are well known in the art and need not be discussed here.

Figure 4:
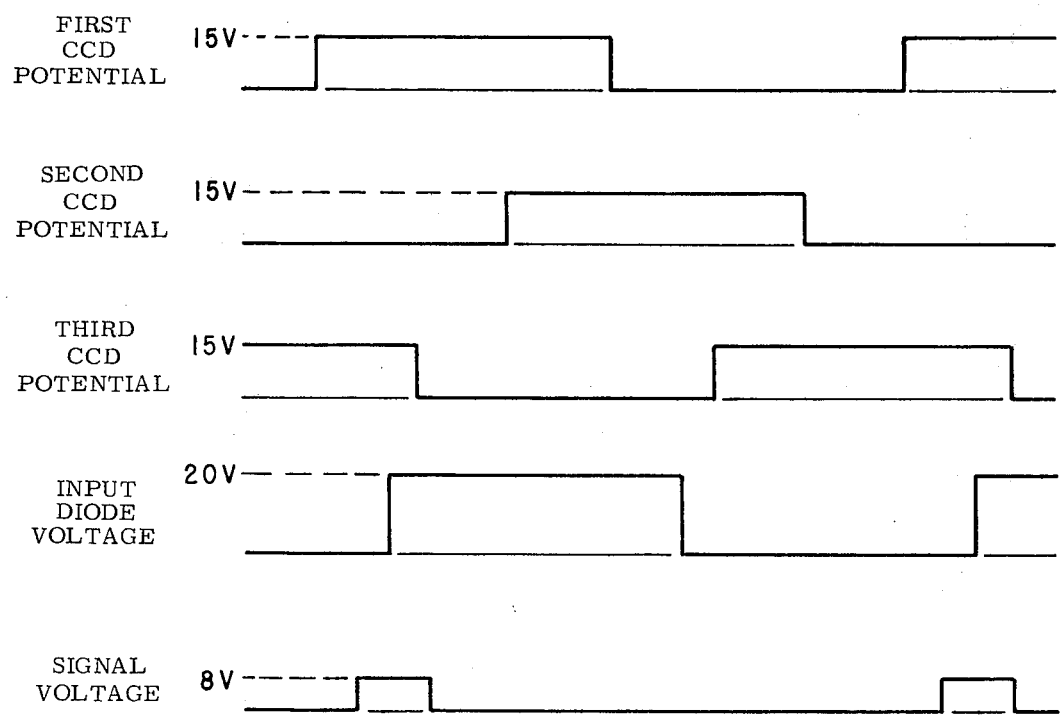
FIG. 4 shows typical waveforms for introducing an electrical input to a CCD without a floating diffused region.

FIG. 4 illustrates the external voltage waveforms, the CCD potentials again alternating between zero and 15 volts sequentially so as to provide for transfer of the charge down the CCD. During the interval when the first CCD potential is at the +15 volt level, a pulse having an amplitude representative of the signal or fat zero to be introduced is applied to gate electrode 58, this amplitude being represented as 8 volts in FIG. 4. During the first portion of this pulse, the input diode voltage is established at zero volts. At this time, there exists a MOSFET structure with the input diode functioning as the source, the gate electrode 58 performing as the MOSFET gate, and the first CCD potential well, whose surface potential is initially at 15 volts being the drain. Under these circumstances, the MOSFET is turned on and charge is transferred from the input diode 54 to the first CCD potential well, thereby filling up the well and causing its surface potential to drop to zero volts. At this time, the input diode voltage is caused to increase to a level shown as 20 volts in FIG. 4, but required only to be some value larger than the largest contemplated signal voltage minus the MOSFET threshold. This reverses the roles of the input diode 54 and the first CCD potential well, the former now acting as a drain with the latter becoming the source of the MOSFET. Now charge is transferred from the first CCD potential well to the input diode 54, thereby causing the surface potential of the first CCD potential well to increase until it reaches a point which differs from the signal voltage by exactly the threshold voltage of the MOSFET. The charge now stored in the first CCD potential well is inversely related to the amplitude of the signal voltage and the turnoff of the MOSFET has been accomplished through the pinchoff phenomena, thereby eliminated charge uncertainty stemming from turnoff of the MOSFET.

Figure 5:
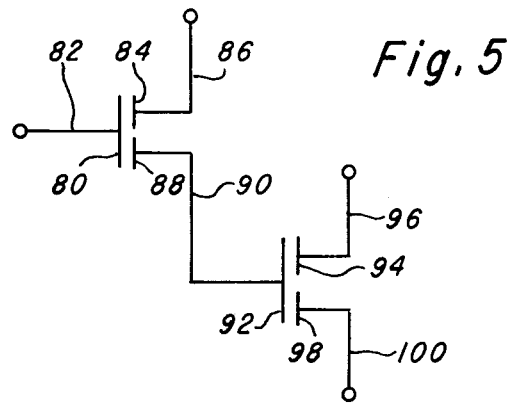
FIG. 5 is an amplifier circuit.

The preset technique is also of interest when it is required to preset an amplifier voltage to a specified value. FIG. 5 illustrates a network having a preset MOSFET coupled by line 90 to a source follower MOSFET, the preset MOSFET being comprised of gate 80 connected to line 82, drain 84 connected to line 86, and source 88. The source follower MOSFET includes gate 92, drain 94 coupled to line 96, and source 98 coupled to line 100. Conventional techniques for establishing a voltage level at the source 88 of the preset transistor would involve applying the desired voltage to line 86 thereby coupling it to the drain 84 of the transistor and applying a sufficiently high voltage to line 82 thereby coupling it to the gate 80 of the transistor so as to turn the transistor on. After the source 88 and any additional capacitance at that node has reached the potential of the input voltage connected to line 86, the gate voltage applied to line 82 is reduced to a low value, thereby turning off the MOSFET. At the instant of turnoff, however, there will be stored under the gate a quantity of charge, a portion of which will normally return to the drain 84 with the remainder passing to the source 88. This results in an uncertainty or noise in the amount of charge stored in the source 88 and consequently in the voltage on the gate 92 of the source follower MOSFET. Improved performance results if the input signal voltage is applied to the gate 80 of the preset MOSFET through line 82 and the drain 84 is established at zero volts through line 86. Under these circumstances, the preset MOSFET turns on thereby drawing the source 88 to the zero volt potential of the drain 84, after which the input voltage applied to the drain 84 through line 86 is switched to some value higher than any possible input voltage applied to line 82. This causes the potential of the source 88 to rise until it reaches a point which differs from the gate potential by exactly the threshold voltage of the MOSFET, at which time the MOSFET pinches off. In this way, the voltage of the source 88 is established at a level related to that of the input signal voltage and charge uncertainty associated with turnoff of the preset MOSFET is eliminated.

Figure 6:
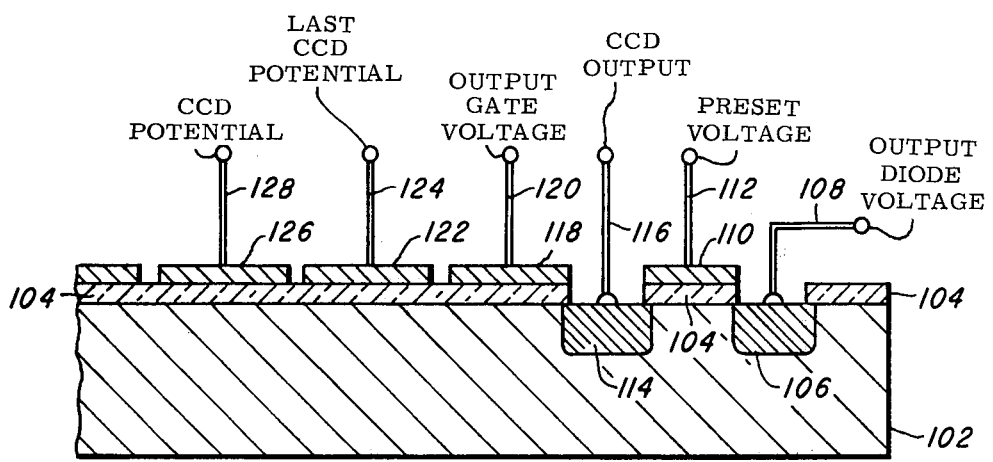
FIG. 6 depicts a CCD output structure.

The preset technique can also be used advantageously at the output of a CCD. FIG. 6 illustrates a portion of a CCD structure formed on a P-type substrate into which have been formed two N-type regions 106 and 114, the former forming an output diode structure and the latter comprising the output node of the CCD. The output diode 106 and output node 114 are provided with external connections by means of ohmic contact and lines 108 and 116. Formed on the surface of the substrate is a thin insulating layer 104 of a substance such as silicon dioxide. Intermediate the two N-type regions is located a preset electrode 110 and its external lead 112. Also shown on the surface of the silicon dioxide layer are CCD electrodes 122 and 126 along with their associated external leads 124 and 128. Intermediate the last CCD electrode 122 and the output node 114 is located an output gate electrode 118 with its external lead 120.

The function of the preset electrode 110 and output diode 106 is to establish the charge level in the output node 114 at a known value prior to each interrogation of the last CCD potential well. This provides a known reference charge level against which to measure the amount of charge introduced to the output node 114 upon interrogation of the last CCD potential well. One possible method for accomplishing this involves introducing to the output diode 106 by means of line 108 the potential that establishes this charge level, and applying a positive gating voltage to the preset electrode 110 by means of line 112. This has the effect of turning on the MOSFET comprised of the output node 114 functioning as a source, the preset electrode 110 as the gate, and the output diode 106 as the drain. The output node 114 and output diode 106 are connected by the channel and the surface potential of the output node 114 is drawn to that of the output diode 106. This procedure, however, has associated with it the undesirable charge uncertainty caused by charge stored under the gate at the instant of turnoff.

An alternative method not subject to this difficulty involves introducing to the preset electrode 110 the reference voltage which is to establish the preset charge level in the output node 114. A large positive potential is connected to output diode 106 by means of line 108 and the structure functions as a MOSFET causing the surface potential of the output node 114 to rise until it reaches a point that differs from the potential on preset electrode 110 by exactly the threshold voltage of the MOSFET. Turnoff now is realized by means of the pinchoff phenomena which causes no additional uncertainty in the amount of charge stored in the output node 114. It has been assumed here that, prior to the preset operation, there was sufficient charge stored in the output node to insure that its surface potential was less than the reference potential placed on the preset electrode 110 by at least the threshold voltage. In a surface channel device, this is normally the case since the use of a fat zero insures that, as a result of the last previous interrogation of the last CCD potential well, there will have been a finite amount of charge introduced at the CCD output node 114. In the case of a buried channel CCD, however, where the use of a fat zero is not necessary, it is possible that prior to the preset operation there may not be sufficient charge stored in the output node 114 to cause its potential to be less than a threshold voltage below the reference voltage placed on electrode 110. In fact, due to subthreshold leakage, under these circumstances the surface potential of the output node 114 may very well be higher than the references potential applied to the preset electrode 110 and the MOSFET will already be pinched off. The preset operation, therefore, will be ineffectual since it can result in no net change in the amount of charge stored in the output node 114.

Proper preset operation can be insured by introducing a zero voltage level to the output diode 106 through line 108 during the first portion of the period in which the reference voltage is connected to the preset electrode 110. This will turn on the MOSFET and draw the surface potential of the output node 114 to that of the output diode 106; that is, zero volts. The surface potential of the output node 114 now being less than the potential of the preset electrode 110, the voltage applied to the output diode 106 can be switched to a high level and the surface potential of the output node 114 will rise until pinchoff occurs. In this way, the charge level of the output node 114 can be preset free of the additional charge uncertainty caused by turnoff of the MOSFET and independent of whether the CCD is operating in a surface or buried channel mode.

It is seen from the above discussion that by presetting a node and allowing the MOSFET to pinch off, charge uncertainties associated with the switching action of the MOSFET are eliminated. While various embodiments of the invention have been disclosed, it is clear that minor modifications to the method can be made within the spirit of the invention. Among these, for example, is the use of an N-type substrate rather than the P-type substrate used for illustration. The use of a substrate voltage other than the zero volt level, assumed throughout this disclosure, would not be departure from the invention. Also in this disclosure a bias voltage has been applied to the CCD electrode involved in the transfer during the entire duration of the transfer. Actually it is only necessary that the CCD electrode be biased during the period when charge is being transferred to or from the CCD potential well.

What is claimed is:

1. A method of inputting charge packets into a charge coupled device structure comprising a semiconductor substrate, a minority carrier charge source region disposed in said substrate near one surface thereof, a minority carrier charge storage region in said substrate near said one surface and spaced apart from said charge source region, an insulating layer disposed on said one surface, and a signal electrode disposed on said insulating layer over said space between said source region and said storage region, wherein each of said charge packets comprises a quantity of charge inversely proportional to the magnitude of an analog input signal comprising the steps of:
   a. simultaneously applying: a source voltage to said charge source of a magnitude smaller than the smallest magnitude of said analog input signals, and a predetermined voltage to said signal electrode of a magnitude which prevents charge flow between said charge source and said charge storage region; then
   b. applying said analog input signal to said signal electrode; and then
   c. increasing the magnitude of said source signal to a value greater than that of the magnitude of said input signal to thereby trap a minority carrier charge packet in said charge storage region of a magnitude inversely proportional to the magnitude of said input signal.

2. A method according to claim 1 and further including the step of:
   a. reapplying said predetermined voltage to said signal electrode after step (c).

3. A method according to claim 2 wherein steps (a)-(d) are sequentially repeated at predetermined rates.

4. A method according to claim 3 wherein said charge coupled device structure further includes a plurality of transfer electrodes disposed on said insulating layer to thereby define a charge propagation channel including a first transfer electrode spaced apart from said charge storage region and a gate electrode disposed on said insulating layer over said space between said storage region and said gate electrode, including the additional steps of:
   e. applying clock signals with one state of a magnitude larger than the largest magnitude of said input signals to said plurality of transfer electrode and with a phase relation for moving minority charge packets from under said first transfer electrode along said propagation channel, and
   f. applying gate pulses of a magnitude greater than the largest magnitude of said input signals to said gate electrode after step (c) while said clock signal on said first transfer electrode is in said one state.

5. A method according to claim 3 wherein said charge coupled device structure further includes a plurality of transfer electrodes disposed on said insulating layer to thereby define a charge propagation channel including a first transfer electrode spaced apart from said charge storage region and a gate electrode disposed on said insulating layer over said space between said storage region and a gate electrode disposed on said insulating layer over said space between said storage region and said gate electrode, including the additional steps of:
   d. applying clock signals with one state of a magnitude larger than the largest magnitude of said input signals to said plurality of transfer electrode and with a phase relation for moving minority charge packets along said propagation channel to under said first transfer electrode, and
   e. applying gate pulses of a magnitude greater than the largest magnitude of said input signal, to said gate electrode after step (c) while said clock signal on said first transfer electrode is in said one state.

6. A method of inputting charge packets into a charge coupled device structure comprising a semiconductor substrate, a minority carrier charge source region disposed in said substrate near one surface thereof, an insulating layer disposed on said one surface, and a plurality of transfer electreodes serially disposed on said insulating layer to form a charge propagation channel, said plurality including a first transfer electrode spaced apart from said charge source region, and a signal electrode disposed on said surface over said space between said charge source region and said first transfer electrode wherein each of said charge packets comprises a quantity of charge inversely proportional to the magnitude of an analog input signal, comprising the steps of:
   a. simultaneously applying: a source voltage to said charge source of a magnitude less than the smallest magnitude of said analog input signals, a first clocking signal to said first transfer electrode of a magnitude greater than the largest magnitude of said analog input signal, and a predetermined voltage to said signal electrode of a magnitude which prevents charge transfer between said charge source and the substrate region beneath said first phase electrode; then
   b. applying said analog input signal to said signal electrode; and then
   c. increasing the magnitude of said source voltage to a value greater than the magnitude of said input signal to thereby trap a minority carrier charge packet under said first transfer electrode of a magnitude inversely proportional to the magnitude of said input signal.

7. A method according to claim 6 and further including the step of:
   d. reapplying said predetermined voltage to said signal electrode after step (c).

8. A method according to claim 7 wherein steps (a)-(d) are sequentially repeated at predetermined rates.

9. A method according to claim 8, including the step of:
   e. applying clock signals with one state of a magnitude larger than the largest magnitude of said input signals to said plurality of transfer electrode and with a phase relation for moving said minority charge packets from under said first transfer electrode along said propagation channel.

* * * * *